United States Patent [19]
Morimoto

[11] Patent Number: 5,099,522
[45] Date of Patent: Mar. 24, 1992

[54] METHOD AND APPARATUS FOR PERFORMING HEAD-TAIL DISCRIMINATION OF ELECTRONIC CHIP COMPONENTS

[75] Inventor: Masakazu Morimoto, Kyoto, Japan

[73] Assignee: Rohm Co., Ltd., Kyoto, Japan

[21] Appl. No.: 510,667

[22] Filed: Apr. 18, 1990

[30] Foreign Application Priority Data

May 29, 1989 [JP] Japan .................. 1-135056

[51] Int. Cl.$^5$ .................. G06K 9/00
[52] U.S. Cl. .................. 382/8; 358/106; 356/237
[58] Field of Search .......... 382/8, 7; 356/445, 442, 356/237; 194/317, 318, 330; 209/573, 541; 358/106

[56] References Cited

U.S. PATENT DOCUMENTS

| | | | |
|---|---|---|---|
| 4,473,842 | 9/1984 | Suzuki et al. | 358/106 |
| 4,490,846 | 12/1984 | Ishida et al. | 382/7 |
| 4,578,810 | 3/1986 | MacFarlane et al. | 382/8 |
| 4,731,855 | 3/1988 | Suda et al. | 382/8 |
| 4,811,410 | 3/1989 | Amir et al. | 382/8 |
| 4,894,790 | 1/1990 | Yotsuya et al. | 382/8 |
| 4,972,493 | 11/1990 | Chemaly | 382/8 |

FOREIGN PATENT DOCUMENTS 57-1906   1/1982   Japan .
60-29260  2/1985   Japan .

Primary Examiner—Leo H. Boudreau
Assistant Examiner—David Fox
Attorney, Agent, or Firm—William H. Eilberg

[57] ABSTRACT

According to the present invention, a magazine retaining parallel rows of respectively plural chip components is moved relative to an image sensor having a row of picture elements in parallel to the rows of chip components. Plural ones of the picture elements correspond to each chip component. The respective chip components in each row are simultaneously detected for head-tail discrimination by utilizing the difference in light reflectivity between the head and tail sides of the chip component.

14 Claims, 3 Drawing Sheets

METHOD AND APPARATUS FOR PERFORMING HEAD-TAIL DISCRIMINATION OF ELECTRONIC CHIP COMPONENTS

BACKGROUND OF THE INVENTION

1. Field of the Invention

This invention relates to head-tail discrimination of electronic chip components such as chip resistors, chip capacitors, chip diodes, chip transistors and chip IC's. More particularly, the invention concerns a method and apparatus for performing head-tail discrimination of chip components prior to mounting them onto circuit boards for example.

2. Description of the Prior Art

In automatic mounting of chip components to circuit boards, it is known to use a vibratory parts feeder which has a helical transfer path extending from a central portion of a circular feeder body to a peripheral portion thereof. The chip components are placed in a hopper portion provided at the central portion of the feeder body, and successively transferred along the helical path by imparting vibration to the feeder body. The chip component, after having been transferred to the peripheral portion of the feeder body, is picked up by a robotic chip mounter for mounting to a corresponding circuit board.

In such a parts feeder, the chip components are randomly placed in the hopper portion, so that many of the chip components are inevitably transferred with their head sides down. Thus, it is necessary to make head-tail discrimination of the chip components during transfer thereof, and to reject the improperly oriented chip components before feeding to the chip mounter. The rejected chip components are acted by a pawl for example, and returned to the hopper portion of the feeder body for re-feeding.

One way to perform head-tail discrimination of chip components is to arrange a photosensor above the helical path of the parts feeder. The photosensor detects the light beams reflected by the surface of each chip component to produce a detection signal which is processed to determine head or tail of the chip component by utilizing difference in light reflectivity between the head and tail sides of the component.

However, this manner of head-tail discrimination is disadvantageous in various respects. First, the photosensor is capable of making head-tail discrimination only chip-by-chip, so that efficiency of head-tail discrimination is very low. Second, the single photosensor (only one bit or picture element) fails to provide reliable head-tail discrimination. Further, the vibratory parts feeder is not capable of transferring the chip components at a constant speed, so that the head-tail discrimination conducted at the vibratory parts feeder inherently has the likelihood of being unreliable regardless of the type of sensors used for head-tail discrimination.

It is conceivable to increase the reliability of head-tail discrimination by arranging a plurality of photosensors above the helical path of the vibratory parts feeder. However, satisfactory efficiency and reliability cannot be obtained as long as head-tail discrimination is conducted at the vibratory parts feeder.

SUMMARY OF THE INVENTION

It is, therefore, an object of the present invention to enable performing head-tail discrimination of chip components at high speed, thereby making it possible to efficiently supply the chip components for a subsequent process such as chip mounting.

Another object of the present invention is to perform head-tail discrimination of chip components with high reliability.

A further object of the present invention is to enable reliable head-tail discrimination without involving cost increase.

According to one aspect of the present invention, there is provided a method for performing head-tail discrimination of electronic chip components comprising the steps of: arranging at least one row of plural chip components within a magazine, each chip component having head and tail surfaces with different light reflectivities; causing a light source to direct light beams toward the row of chip components so that the light beams are reflected by the surfaces of the respective chip components; causing an image sensor to detect the reflected light beams for simultaneously producing image signals of the respective chip components, the image sensor having at least one row of picture elements in parallel to the row of chip components, plural ones of the picture elements corresponding to said each chip component; and processing said image signals to determine head or tail of the respective chip components.

According to another aspect of the present invention, there is provided an apparatus for performing head-tail discrimination of electronic chip components comprising: a magazine for retaining at least row of plural chip components, each chip component having head and tail surfaces with different light reflectivities; a light source for directing light beams toward the row of chip components so that the light beams are reflected by the surfaces of the respective chip components; an image sensor for detecting the reflected light beams for simultaneously producing image signals of the respective chip components, the image sensor having at least one row of picture elements in parallel to the row of chip components, plural ones of the picture elements corresponding to said each chip component; and processing means for processing the image signals to determine head or tail of the respective chip components.

In view of cost reduction, the image sensor is preferably in the form of a line image sensor having a single row of picture elements. Further, the total number of picture elements to be incorporated in the line image sensor should be selected so that at least 10 picture elements are assigned to each chip component to provide reliable head-tail discrimination. Advantageously, the line image sensor may be caused to detect the reflected light beams along different scanning lines at the same row of chip components to produce different kinds of image signals which are summed for the respective chip components, the summed image signals being processed to determine head or tail of the respective chip components.

Other objects, features and advantages of the present invention will be fully understood from the following detailed description given with reference to the accompanying drawings.

DETAILED DESCRIPTION

Figure 1:
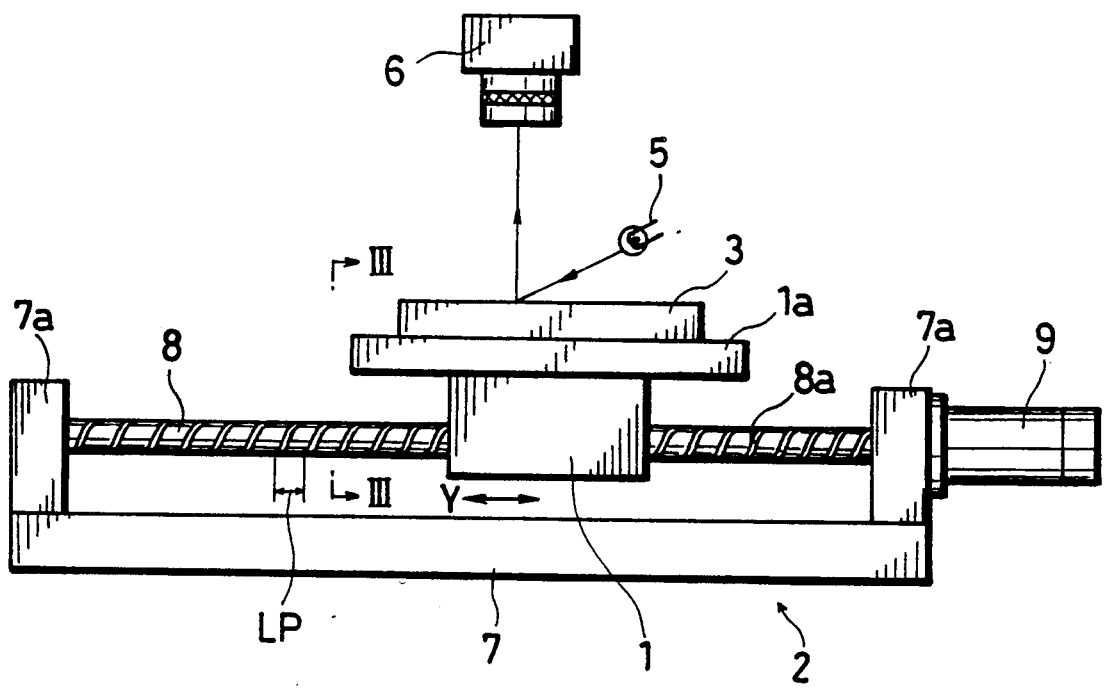
FIG. 1 is a side view showing a head-tail discriminating apparatus according to the present invention.
Figure 2:
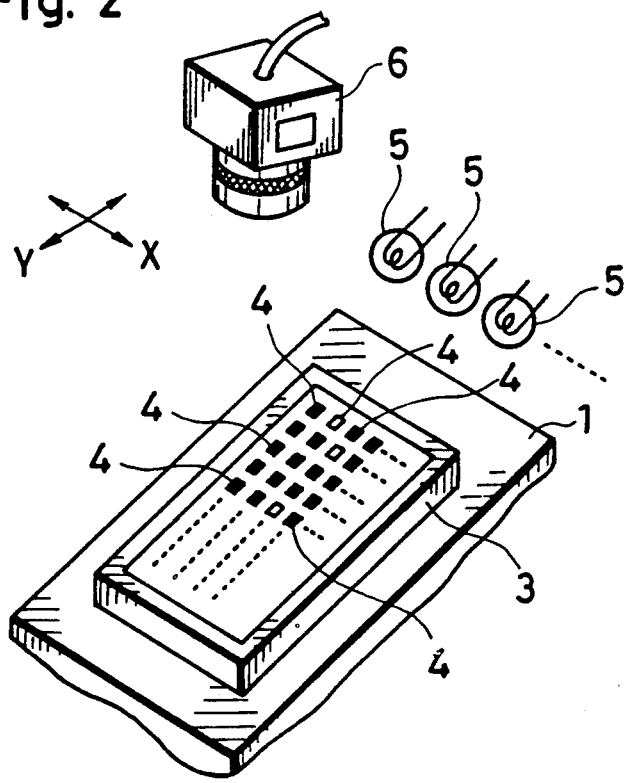
FIG. 2 is a fragmentary perspective view showing a principal portion of the head-tail discriminating apparatus.
Figure 3:
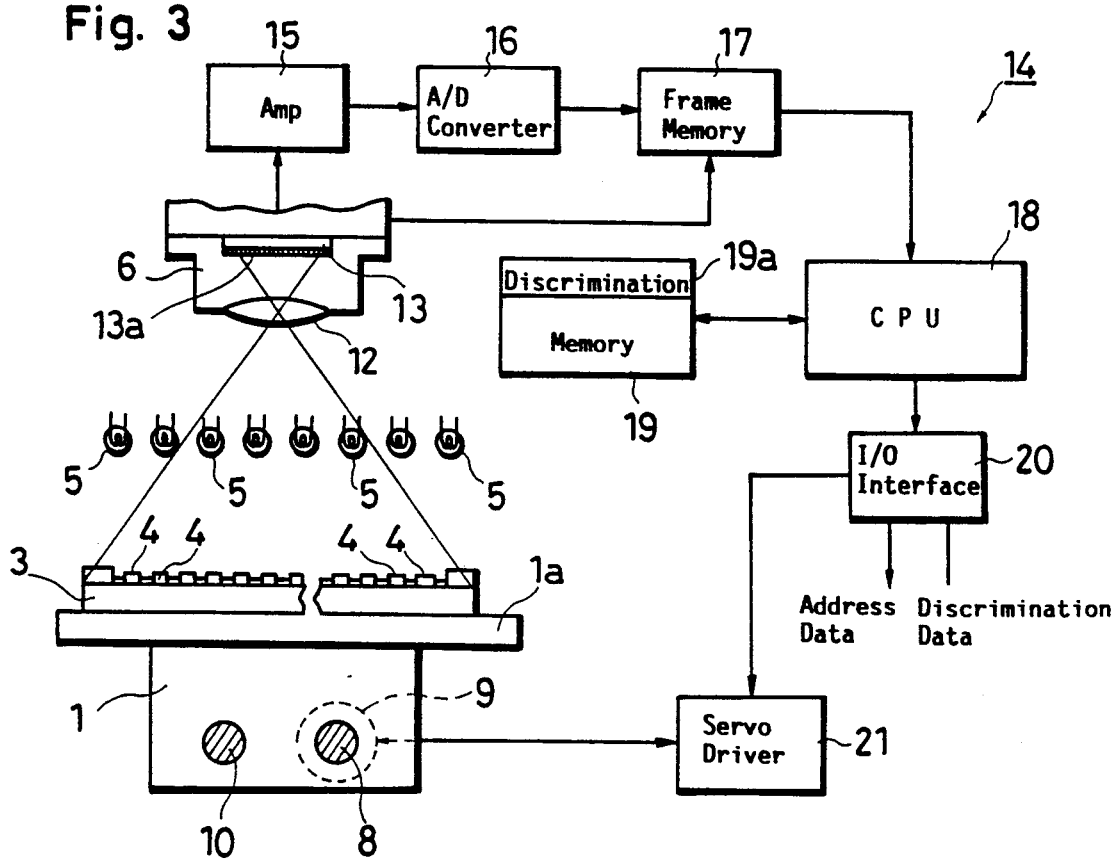
FIG. 3 is a front sectional view taken on lines III—III in FIG. 1 and also showing a processing system for the head-tail discriminating apparatus.

Referring now to FIGS. 1 to 3 of the accompanying drawings, a head-tail discriminating apparatus according to the present invention comprises a carriage 1 which is movable back and forth by means of a transfer mechanism 2. The discriminating apparatus further comprises a magazine 3 for containing a multiplicity of electronic chip components 4 in a matrix, a plurality of lamps 5 for directing light beams toward the magazine from above, and a camera 6 disposed above the magazine to detect the reflected light beams. The details of these components are now described below.

The transfer mechanism 2 includes a base 7 having a pair of end support walls 7a. A feed screw 8 extends between the support walls, and is rotatably supported thereby. The feed screw is reversibly rotated by a servo motor 9 mounted on one of the end support walls 7a. Between the support walls also extends a guide rod 10 (FIG. 3). The feed screw and the guide rod penetrate through the carriage 1.

As shown in FIG. 1, the feed screw 8 is formed with a helical groove 8a. The carriage 1 is provided, at the hole receiving the feed screw, with balls (not shown) engaging with the helical groove of the screw. Thus, when the servo motor 9 is rotated, the carriage together with the magazine 3 thereon is advanced or retreated along the feed screw and the guide rod 10, as indicated by a double headed arrow Y.

According to the illustrated example, the servo motor 10 is designed to make one full rotation upon receiving 1,000 driving pulses, whereas the lead LP of the feed screw 8 is 10 mm. Thus, the carriage 3 moves by 10 mm upon one full rotation (1,000 pulses) of the feed screw, and it is possible to minutely control the movement of the carriage in the order of 10 micrometers (corresponding to 1 pulse).

Figure 4:
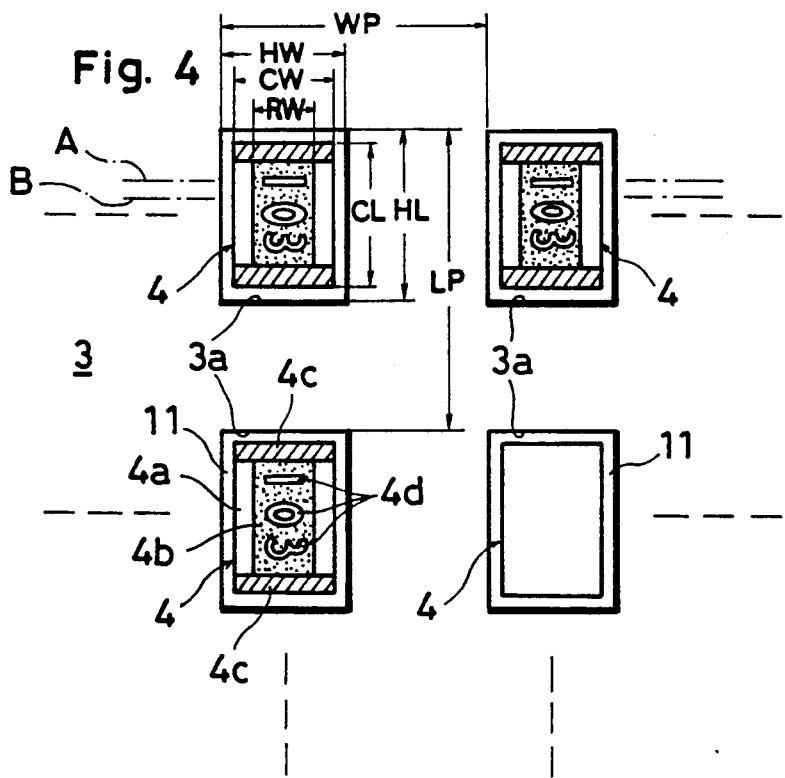
FIG. 4 is an enlarged plan view showing the arrangement of chip components to be optically inspected.

The magazine 3 is replaceably mounted on a top support portion 1a of the carriage 1. The position of the magazine relative to the carriage support portion 1a is precisely adjusted by utilizing positioning members (not shown) provided on the carriage support portion. The magazine has a matrix of retaining holes 3a for the chip components 4, as shown in FIG. 4. The hole matrix includes rows extending in a direction X which is perpendicular to the transfer direction Y of the magazine.

According to the illustrated embodiment, the hole matrix of the magazine 3 consists of 50 rows each including 40 chip retaining holes. Each hole 3a has a length HL of e.g. 2.2 mm and a width HW of e.g. 1.45 mm. The pitch (longitudinal pitch) LP between two adjacent rows is 4.5 mm for example, whereas the pitch (widthwise pitch) WP between two adjacent holes in each row is 4 mm for example.

The chip components 4 accommodated in the matrix of chip retaining holes 3a of the magazine 3 may be of any type. According to the illustrated embodiment, each chip component is in the form of a chip resistor which comprises a ceramic substrate 4a formed on its head surface with a resistor coating 4b in conduction with a pair of electrodes 4c. The resistor coating 4b may be provided with an identification marking 103.

Obviously, the chip resistor 4 must be smaller in size than the corresponding chip retaining hole 3a, so that a small gap 11 is formed between these two. According to the illustrated example, the chip resistor has a length CL of e.g. 2.0 mm and a width CW of e.g. 1.25 mm. The width RW of the resistor coating 4b may be 0.73 mm for example.

In the chip resistor 4, the ceramic substrate 4a provides a substantially white background in which the darker or black resistor coating 4b is contained. Thus, the darker side of the chip is the head surface thereof. However, the identification marking 4d on the resistor coating 4b usually has a color which is indistinguishably similar in brightness or light reflection from the white ceramic substrate. In fact, this marking has been one of the causes which have conventionally made it difficult to reliably conduct an intended head-tail discrimination. The discriminating apparatus according to the present invention can provide a reliable head-tail discrimination in spite of the presence of such a marking, as hereinafter described.

In FIG. 2, those chip resistors with their heads directed upward are indicated in black, whereas the other chips which are indicated in white have their tails directed upward. By utilizing a vibratory loader (not shown) for supplying the chips 4 into the magazine 3, it is possible to make the heads of the loaded chips directed upward with about 90% possibility. However, such a loader is not the subject of the present invention, and therefore not described in detail.

The lamps 5 are arranged in a row extending in the arrow X direction to uniformly irradiate the rows of chips 4 in the magazine 3. Usually, five or more such lamps are provided to ensure uniform irradiation.

The camera 6 incorporates an optical lens system 12 for forming an image of the magazine surface on a line image sensor (line CCD) 13, as shown in FIG. 3. The line image sensor has a multiplicity of picture elements 13a arranged in a single row extending in the direction X within a length for optically covering substantially the entire width of the magazine.

According to the illustrated embodiment, the total number of picture elements 13a, or charge-coupled devices, incorporated into the line image sensor 13 is 4,096. Further, the width RW (FIG. 4) of the resistor coating 4b of a single chip resistor 4 corresponds to 17 picture elements.

The movement control of the carriage 1 and the processing of the optical data are performed by a processing system 14. This processing system comprises an amplifier 15, an A/D converter 16, a frame memory 17, a central processing unit (CPU) 18, a memory 19, an I/0 interface 20, and a servo driver 21, as shown in FIG. 3. The operation of these parts are described below with particular reference to FIGS. 3 and 5.

The servo driver 21 receives control signals from the CPU 18 through the interface 20, and feeds drive signals to the servo motor 9 to move the carriage 1 in the direction Y (see FIG. 1). The servo driver also feeds back position signals to the CPU through the interface to provide the Y-direction address of the chip matrix.

According to the illustrated example, the drive of the servo motor 20 is such as to enable the X-direction optical scanning at two different Y-positions with respect to each row of chip resistors 4. Specifically, as shown in FIG. 4, the carriage 1 or the magazine 3 is first stopped in Y-direction transfer to enable the X-direction scanning of the first row of resistor chips along a first scanning line A, and thereafter advanced supplementally by a small amount to enable the X-direction scanning of the same chip row along a second scanning line B. Subsequently, the carriage is advanced in the Y-direction by a larger amount to enable the first X-direction scanning of the second row of chip resistors, followed by the supplemental feeding to enable the second X-direction scanning. The same manner of carriage transfer is repeated until the entire chip matrix is optically covered, the X-direction scanning being conducted twice for each row of chip resistors.

Figure 5:
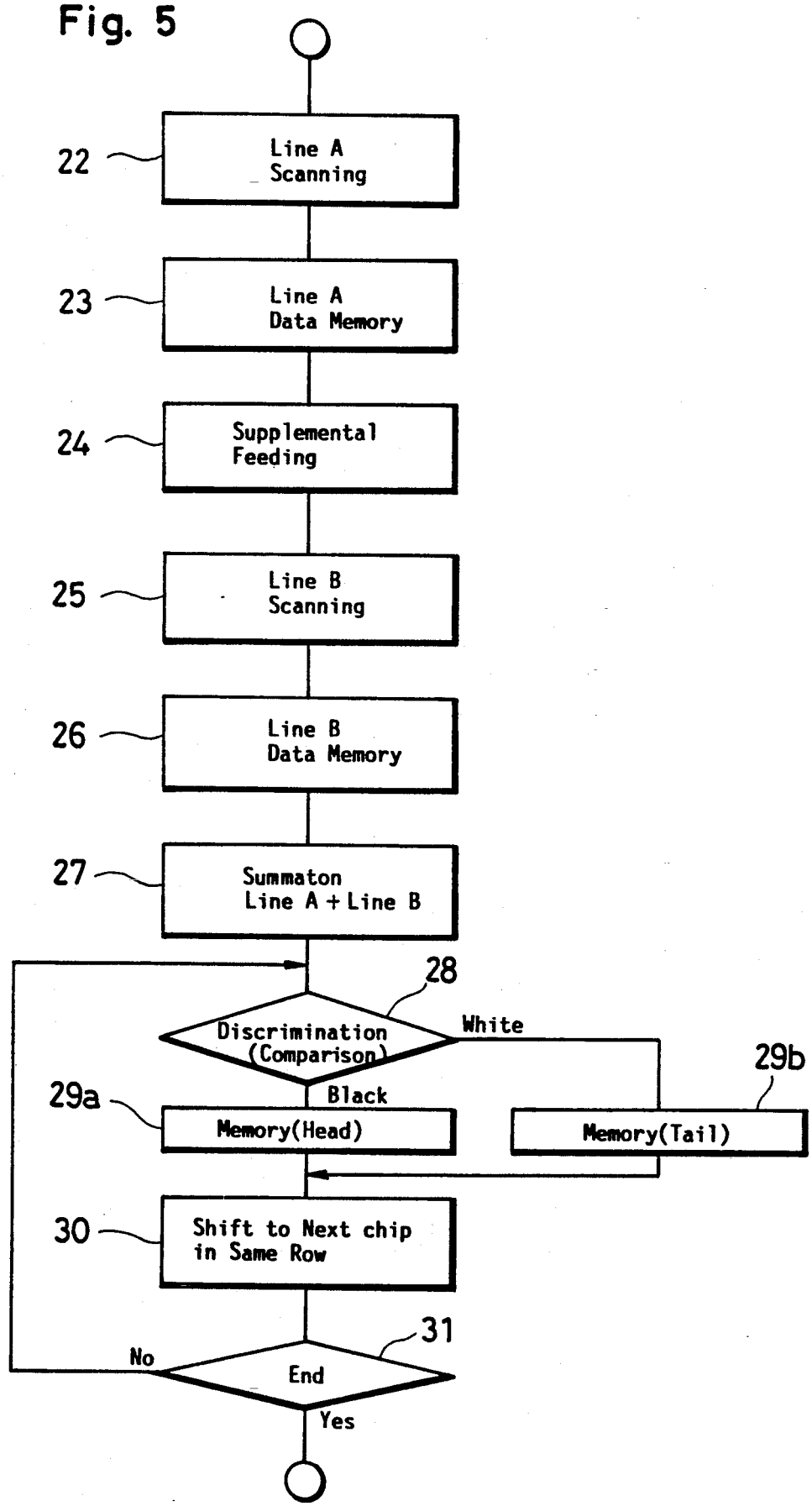
FIG. 5 is a flow diagram showing the sequence of performing head-tail discrimination of the chip components.

In the process flow diagram shown in FIG. 5, the first X-direction scanning of each row of chip resistors 4 is indicated by block 22, whereas the second or supplemental X-direction scanning of the same chip row is represented by block 25. The supplemental feeding of the carriage 1 is designated by block 24.

The dual X-direction scanning of each chip row provides reliable head-tail discrimination in spite of the presence of the identification marking 4d which is indistinguishably similar in light reflection from the white substrate 4a. To explain this, it is now assumed that the first X-direction scanning line A overlaps the marking of a particular chip resistor, as shown in FIG. 4. In this scanning line alone, therefore, the scanning data may likely to cause erroneous recognition as tail-side up. However, the second scanning line B is located completely clear of the marking. Thus, by summing the two kinds of data, it is possible to correctly discriminate that particular chip as head-side up. The dual scanning is also advantageous in providing correct surface discrimination even if the chip assumes an arbitrary position within the corresponding chip retaining hole 3a due to size difference therebetween.

The amount of the supplemental feeding may be optionally determined depending on the types of chip components to be optically inspected or the types of identification markings attached thereto. Usually, satisfactory results will be obtained if the supplemental feeding is selected within a range of 1-10 mm (5 mm for example).

It is of course possible to conduct the X-direction scanning three or more times to further increase the reliability of head-tail discrimination. Further, the line image sensor 13 may be replaced by an area image sensor incorporating a multiplicity of CCD's in plural rows extending in the X-direction. In this case, the X-direction scanning need be conducted only once with respect to each row of chip resistors 4. However, the line image sensor is preferred in that it requires a smaller number of CCD's than the area image sensor.

The analog image signals produced by the line image sensor 13 are amplified by the amplifier 15 and fed to the A/D converter 16. The A/D converter samples the image signals and converts them to digital signals in e.g. 256 gradations for the respective chip resistors 4 in each row.

The frame memory 17 stores the digital image signals from the A/D converter 16. To synchronize the memory start with the first signal from the image sensor 13, a synchronizing signal is supplied from the sensor to the frame memory. It should be appreciated that the frame memory has a capacity of storing the image signals of the entire chip matrix (magazine 3) even if the X-direction scanning is conducted twice or more with respect to each row of chip resistors 4.

In FIG. 5, block 23 indicates storage at the frame memory 17 (FIG. 3) of the image signals obtained by the X-direction scanning along the line A (FIG. 4). On the other hand, block 26 represents memorization for the image signals taken at the X-direction scanning line B (FIG. 4).

The CPU 18 reads out the image signals from the frame memory 17, and sums the line A data and the line B data for each chip resistor in each row. The CPU further compares the sum with a preset threshold value to make head-tail discrimination in accordance with a discrimination program 19a stored in the memory 19. The discrimination result thus obtained is stored in the memory 19 together with the X-Y address of the chip resistor. Such discrimination process is performed chip-by-chip for each row of chip resistors.

Regarding the X-Y address of each chip resistor, the Y-direction address is obtained by the position signal fed back from the servo driver 21, as described hereinbefore. Obviously, the Y-direction address is renewed every time the X-direction scanning position is shifted from one row of chip resistors to another row. On the other hand, the X-direction address of the chip resistor is directly obtained by the position of those CCD's corresponding to that particular resistor.

In FIG. 5, the summation of the two kinds of data (line A data and line B data) is indicated by block 27, whereas the discrimination or comparison process is represented by block 28. The memorization of the discrimination results is represented by blocks 29a, 29b. After completion of the discriminating process with respect to one chip in each row, a predetermined data area (corresponding to the spacing between two adjacent chips in the same row) is skipped (block 30), and the summed data for the next chip in the same row are similarly processed for head-tail discrimination starting again from the block 28. When the last chip in the same row has been subjected to head-tail discrimination, the process ends with respect to that row (block 31), and a similar process is repeated for the next row of chip resistors starting again from the block 22.

After the head-tail discrimination of the entire chip matrix (magazine) is finished, the discrimination results together with the address data are read out through the interface 20, as shown in FIG. 3. The discrimination outputs include high level signals representative of the head side as well as low level signals indicative of the tail side. The outputs are fed to a chip handling apparatus (not shown) such as chip mounting apparatus for controlling thereof.

The magazine 3 having been inspected is removed from the carriage 1 (FIG. 1 or 3) and transferred to a position where the chip handling apparatus is located. The handling apparatus picks up only those chip resistors having their head surfaces directed upward, and mounts them onto circuit boards for example. The rejected chip resistors are returned to the hopper (not shown) of the vibratory loader (hereinbefore described) for loading, together with other chip resistors, into another magazine. Further, the carriage 1 is returned to its initial position to receive a newly loaded magazine for optical scanning.

According to the present invention, head-tail discrimination is performed substantially simultaneously with respect to plural chip components in each row. This manner of head-tail discrimination is much more efficient than the prior art method wherein individual chips are sequentially transferred while being successively subjected to head-tail discrimination by means of a photosensor or photosensors. Thus, the present invention can contribute greatly to the realization of high speed chip mounting or other chip handling.

Further, plural picture elements, preferably 10 or more picture elements, of the image sensor 13 are assigned to each chip component to increase the resolution of the chip image and thereby the reliability of the head-tail discrimination. Such a reliable discrimination is not possible with the prior art method wherein a photosensor (one bit or picture element) roughly detects the light reflection of the chip component.

According to the illustrated embodiment, the line image sensor 13 makes X-direction scanning along two different scanning lines A, B (FIG. 4) for each row of chip resistors 4. This dual scanning further increases the reliability of head-tail discrimination even if each chip resistor is provided with an optically confusing marking 4d.

The present invention being thus described, it is obvious that the same may be varied in many ways. For instance, the carriage 1 together with the magazine 3 may be held stationary while the image sensor 6 together with the lamps 5 may be moved relative to the magazine to conduct scanning in the Y-direction. Further, any number of picture elements may be assigned to each chip as long as the selected number of picture elements is sufficient to provide an chip image with such a resolution as to enable reliable head-tail discrimination of the chip. Moreover, the image signals obtained by the image sensor may be processed to discriminate the brighter side (white side) of the chip as its head side depending on the nature of the chip component to be optically scanned. Such variations are not to be regarded as a departure from the spirit and scope of the invention, and all such modifications as would be obvious to those skilled in the art are intended to be included within the scope of the following claims.

I claim:

1. A method for performing head-tail discrimination of electronic chip components before mounting thereof comprising the steps of:
    arranging at least one row of plural chip components within a magazine having at least one corresponding row of chip retaining recesses for removably retaining said row of chip components, each chip component having head and tail surfaces with different light reflectivities;
    causing a light source to direct light beams toward said row of chip components so that the light beams are reflected by the surfaces of the respective chip components;
    causing an image sensor to detect the reflected light beams for simultaneously producing image signals of the respective chip components in said row, said image sensor being capable of optically covering the entirety of said row of chip components, said image sensor having at least one row of picture elements in parallel to said row of chip components, plural ones of said picture elements corresponding to said each chip component; and
    processing said image signals to determine head or tail of the respective chip components.

2. The method as defined in claim 1, wherein the total number of picture elements are selected so that at least 10 picture elements are assigned to each chip component.

3. The method as defined in claim 1, wherein said processing of said image signals comprises digitizing said image signals in plural gradations, and comparing the gradated digital image signals with a preset threshold value to determine head or tail of the respective chip components.

4. The method as defined in claim 1, wherein said image sensor is caused to detect the reflected light beams along different scanning lines at said row of chip components to produce different kinds of image signals, said different kinds of image signals being summed for the respective chip components, the summed image signals being processed to determine head or tail of the respective chip components.

5. The method as defined in claim 1, wherein said magazine retains parallel rows of respectively plural chip components, the method further comprising the steps of:
    transferring said magazine relative to said image sensor in a direction transverse to said rows of chip components; and
    causing said magazine to repetitively stop relative to said image sensor so that said image sensor detects the reflected light beams at each row of chip components.

6. The method as defined in claim 5, wherein said image sensor is caused to detect the reflected light beams along different scanning lines at said each row of chip components to produce different kinds of image signals, said different kinds of image signals being summed for the respective chip components in said each row, the summed image signals being processed to determine head or tail of the respective chip components.

7. An apparatus for performing head-tail discrimination of electronic chip components before mounting thereof comprising:
    a magazine having at least one row of chip retaining recesses for removably retaining a corresponding row of plural chip components, each chip component having head and tail surfaces with different light reflectivities;
    a light source for directing light beams toward said row of chip components so that the light beams are reflected by the surfaces of the respective chip components;
    an image sensor for detecting the reflected light beams for simultaneously producing image signals of the respective chip components in said row, said image sensor being capable of optically covering the entirety of said row of chip components, said image sensor having at least one row of picture elements in parallel to said row of chip components, plural ones of said picture elements corresponding to said each chip component; and
    processing means for processing said image signals to determine head or tail of the respective chip components.

8. The apparatus as defined in claim 7, wherein the total number of picture elements are selected so that at least 10 picture elements are assigned to each chip component.

9. The apparatus as defined in claim 7, further comprising transfer means for transferring said magazine relative to said image sensor in a direction transverse to said row of chip components, said transfer means being capable of stopping said magazine relative to said image sensor so that said image sensor detects the reflected light beam at said row of chip components.

10. The apparatus as defined in claim 9, wherein said transfer means is capable of slightly moving said magazine relative to said image sensor in said direction so that said image sensor detects the reflected light beams along different scanning lines at said row of chip components to produce different kinds of image signals, said processing means being capable of summing said different kinds of image signals for the respective chip components to determine head or tail of the respective chip components on the basis of the summed image signals.

11. The apparatus as defined in claim 9, wherein said magazine retains parallel rows of respectively plural chip components, and said transfer means is capable of repetitively stopping said magazine relative to said image sensor so that said image sensor detects the reflected light beams at each row of chip components.

12. The apparatus as defined in claim 11, wherein said transfer means is capable of slightly moving said magazine relative to said image sensor in said direction so that said image sensor detects the reflected light beams along different scanning lines at each row of chip components to produce different kinds of image signals, said processing means being capable of summing said different kinds of image signals for the respective chip components in said each row to determine head or tail of the respective chip components on the basis of the summed image signals.

13. The apparatus as defined in claim 9, wherein said transfer means comprises a feed screw extending in said transverse direction, a carriage supporting said magazine and moved in said transverse direction upon rotation of said feed screw, and a servo motor for rotating said screw, said processing means incorporating a servo driver for controlling rotation of said servo motor.

14. The apparatus as defined in claim 7, wherein said processing means is capable of digitizing said image signals in plural gradations as well as comparing the gradated digital image signals with a preset threshold value to determine head or tail of the respective chip components.

* * * * *